United States Patent
Yoshino et al.

(10) Patent No.: US 11,760,771 B2
(45) Date of Patent: Sep. 19, 2023

(54) RUTHENIUM COMPOUND, RAW MATERIAL FOR FORMING THIN FILM, AND METHOD FOR PRODUCING THIN FILM

(71) Applicant: ADEKA CORPORATION, Tokyo (JP)

(72) Inventors: Tomoharu Yoshino, Tokyo (JP); Masaki Enzu, Tokyo (JP); Nana Okada, Tokyo (JP); Masako Hatase, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 521 days.

(21) Appl. No.: 16/760,171

(22) PCT Filed: Jul. 27, 2018

(86) PCT No.: PCT/JP2018/028271
§ 371 (c)(1),
(2) Date: Apr. 29, 2020

(87) PCT Pub. No.: WO2019/097768
PCT Pub. Date: May 23, 2019

(65) Prior Publication Data
US 2020/0262854 A1 Aug. 20, 2020

(51) Int. Cl.
*C07F 15/00* (2006.01)
*C23C 16/18* (2006.01)
*C23C 16/455* (2006.01)
*H01L 21/285* (2006.01)

(52) U.S. Cl.
CPC .......... *C07F 15/0046* (2013.01); *C23C 16/18* (2013.01); *C23C 16/45525* (2013.01); *C23C 16/45553* (2013.01); *H01L 21/28556* (2013.01); *H01L 21/28568* (2013.01)

(58) Field of Classification Search
CPC ................. C07F 15/0046; C23C 16/18; C23C 16/45525; C23C 16/45553
See application file for complete search history.

(56) References Cited

U.S. PATENT DOCUMENTS

2006/0229462 A1* 10/2006 Thompson .............. C23C 16/18
556/137
2008/0107812 A1 5/2008 Dussarrat et al.

FOREIGN PATENT DOCUMENTS

| CN | 101122010 | 2/2008 | |
|---|---|---|---|
| WO | 2010/071364 | 6/2010 | |
| WO | 2017/009947 | 1/2017 | |
| WO | WO-2017009947 A1 * | 1/2017 | ............. C23C 16/44 |

OTHER PUBLICATIONS

Extended European Search Report dated Jun. 17, 2021 in corresponding European Patent Application No. 18877651.2.
International Search Report dated Oct. 16, 2018 in International (PCT) Application No. PCT/JP2018/028271.
Huazhi Li et al.,"Synthesis and Characterization of Ruthenium Amidinate Complexes as Precursors for Vapor Deposition", The Open Inorganic Chemistry Journal, vol. 2, 2008, pp. 11-17.

* cited by examiner

*Primary Examiner* — Pancham Bakshi
(74) *Attorney, Agent, or Firm* — Wenderoth, Lind & Ponack, L.L.P.

(57) ABSTRACT

A ruthenium compound represented by a general formula described in the specification, a raw material which is for forming a thin film and which contains the ruthenium compound, and a method of producing a thin film using the raw material for forming a thin film are provided.

3 Claims, 2 Drawing Sheets

RUTHENIUM COMPOUND, RAW MATERIAL FOR FORMING THIN FILM, AND METHOD FOR PRODUCING THIN FILM

TECHNICAL FIELD

The present invention relates to a novel ruthenium compound having a specific structure, a raw material which is for forming a thin film and which contains the compound, and a method of producing a thin film in which a thin film containing ruthenium is formed using the raw material.

BACKGROUND ART

Materials which are for forming thin films and which contain elemental ruthenium exhibit distinctive electrical characteristics and are applied in various uses. For example, they are used as electrode materials of memory elements represented by DRAM elements, resistive films, diamagnetic films used for recording layers of hard disks, catalyst materials for solid polymer fuel cells, and the like.

Examples of methods of producing such thin films include sputtering methods, ion plating methods, MOD methods such as a coating pyrolysis method and a sol-gel method, and chemical vapor deposition methods. Among these, chemical vapor deposition (hereinafter also simply referred to as "CVD") methods such as an atomic layer deposition (ALD) method is an optimal production process because it has many advantages such that it has excellent composition controllability and step coverage, is suitable for mass production, and enables hybrid integration.

Regarding ruthenium compounds used as raw materials for a CVD method, various ruthenium compounds have been reported up to now. For example, Patent Document 1 discloses a ruthenium compound in which two carbonyl groups and two ketimine groups having a specific structure are bonded to ruthenium, but there is no description on the ruthenium compounds of the present invention. Also, since the ruthenium compound disclosed in Patent Document 1 has a melting point of 100° C. or higher, it is not a compound that can be fully satisfactory as a raw material for chemical vapor deposition.

CITATION LIST

Patent Document

[Patent Document 1] WO 2010/071364

SUMMARY OF INVENTION

Technical Problem

In methods of forming thin films by vaporizing a compound such as a CVD method, properties required of a compound (precursor) used as a raw material include a low melting point which enables transportation in a liquid state, a low viscosity of a liquid, a high vapor pressure which enables easy vaporization, and high thermal stability. Among these, when used in an ALD method, having a temperature range that can be applied to an ALD method called an ALD window is required. In particular, regarding a ruthenium compound used in the ALD method, a compound having an ALD window, a high vapor pressure, and a low melting point is required. However, conventional ruthenium compounds have not been fully satisfactory in such respects.

Accordingly, an object of the present invention is to provide a ruthenium compound having a high vapor pressure and a lower melting point than conventionally known compounds, a raw material which is for forming a thin film and which contains the compound, and a method of producing a thin film in which a thin film containing ruthenium is formed using the raw material.

Solution to Problem

As a result of repeated examinations, the inventors found that a ruthenium compound having a specific structure can address the above problems and thus developed the present invention.

Specifically, the present invention relates to a ruthenium compound represented by the following general formula (1):

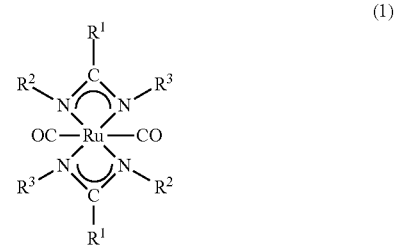

(wherein, $R^1$ to $R^3$ each independently represent a $C_{1-5}$ alkyl group, provided that when $R^1$ is a methyl group, $R^2$ and $R^3$ are groups different from each other).

In addition, the present invention provides a raw material which is for forming a thin film and which contains the ruthenium compound represented by general formula (1).

In addition, the present invention provides a method of producing a thin film containing ruthenium atoms on a surface of a substrate, comprising the steps of:
vaporizing the raw material for forming a thin film described above to produce vapor containing the ruthenium compound;
introducing the vapor into a processing atmosphere; and
depositing the compound on a substrate through decomposition of the compound or chemical reaction of the compound, or through both deposition and chemical reaction of the compound.

Advantageous Effects of Invention

According to the present invention, it is possible to obtain a ruthenium compound having a high vapor pressure and a low melting point, the compound being suitably used for a CVD method as a raw material for forming a thin film used, and particularly, having an ALD window so that it can be suitably used for an ALD method as a raw material for forming a thin film.

DESCRIPTION OF EMBODIMENTS

Figure 1:
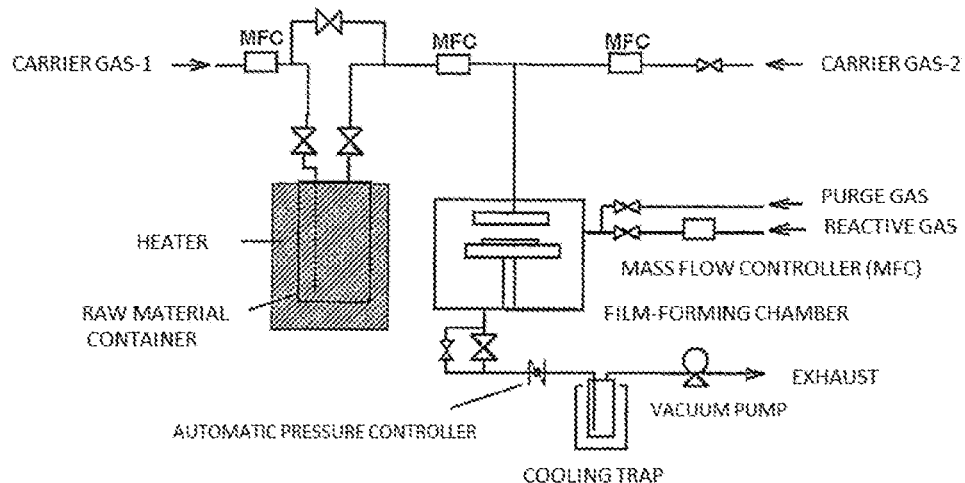
FIG. 1 is a schematic view showing an example of a chemical vapor deposition device used in a method of producing a thin film according to the present invention.

A ruthenium compound of the present invention is represented by general formula (1) and is a compound in which carbon monoxide is added to ruthenium atoms. The ruthenium compound of the present invention is suitable as a precursor in a thin film production method including a vaporization process such as a CVD method, and is a precursor that can be applied for an ALD method and thus is especially suitable as a precursor used in the ALD method.

In general formula (1), $R^1$ to $R^3$ each independently represent a $C_{1-5}$ alkyl group, provided that when $R^1$ is a methyl group, $R^2$ and $R^3$ are groups different from each other.

In general formula (1), examples of $C_{1-5}$ alkyl groups represented by $R^1$ to $R^3$ include methyl, ethyl, n-propyl, isopropyl, n-butyl, sec-butyl, tert-butyl, isobutyl, n-pentyl, sec-pentyl, tert-pentyl, isopentyl, and neopentyl groups.

In general formula (1), $R^1$, $R^2$ and $R^3$ are appropriately selected according to a method of producing a thin film to be applied. When used in a method of producing a thin film including a process of vaporizing a compound, it is preferable that a combination of $R^1$, $R^2$ and $R^3$ assumes a liquid state under ordinary pressure at ordinary temperature and makes vapor pressure high.

Specifically, those in which $R^1$ is a methyl, ethyl, or n-propyl group are preferable because they have a high vapor pressure. Among these, those in which $R^1$ is a methyl or ethyl group are particularly preferable. In addition, those in which $R^3$ is a tert-butyl group are preferable because they have a low melting point, those in which $R^3$ is a tert-butyl group and $R^2$ is a methyl, ethyl, n-propyl, isopropyl, n-butyl, or sec-butyl group are more preferable, and those in which $R^3$ is a tert-butyl group and $R^2$ is an ethyl group are preferable because they have a particularly low melting point.

In addition, those in which $R^1$ is a methyl or ethyl group, $R^3$ is a tert-butyl group, and $R^2$ is an ethyl group are particularly preferable because they have a high vapor pressure and a low melting point, and those in which $R^1$ is a methyl group, $R^3$ is a tert-butyl group, and $R^2$ is an ethyl group are preferable because they have a particularly low melting point and a low viscosity in a liquid state at 25° C. Meanwhile, in a method of producing a thin film according to an MOD method not including a vaporization process, $R^1$, $R^2$ and $R^3$ can be arbitrarily selected according to the solubility in a solvent to be used, a thin film formation reaction, and the like.

Preferable specific examples of the ruthenium compound of the present invention include the following Compounds No. 1 to No. 217.

Here, in the following chemical formulae, "Me" represents a methyl group, "Et" represents an ethyl group, "nPr" represents an n-propyl group, "iPr" represents an isopropyl group, "sBu" represents a sec-butyl group, "tBu" represents a tert-butyl group, and "tAm" represents a tert-pentyl group.

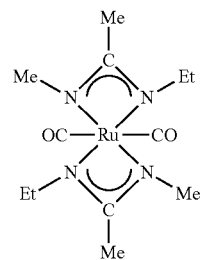

Compound No. 1

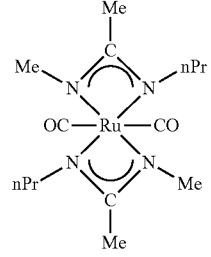

Compound No. 2

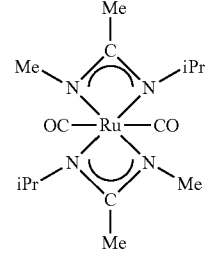

Compound No. 3

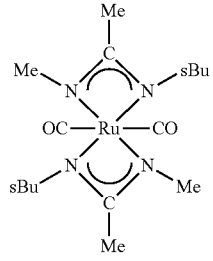

Compound No. 4

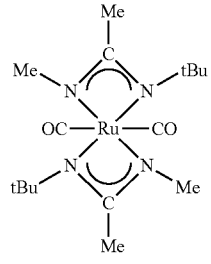

Compound No. 5

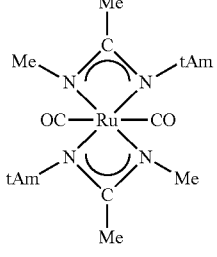

Compound No. 6

-continued
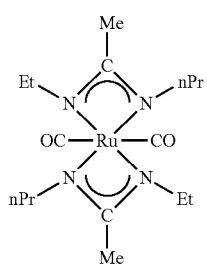
Compound No. 7
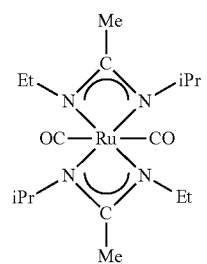
Compound No. 8
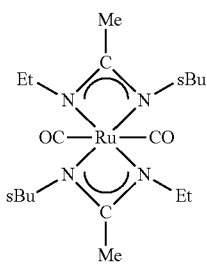
Compound No. 9
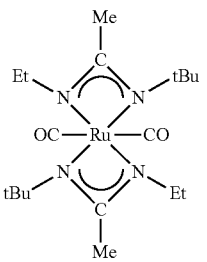
Compound No. 10
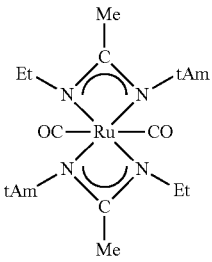
Compound No. 11
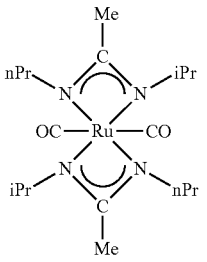
Compound No. 12
-continued
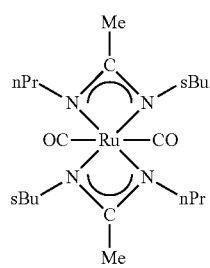
Compound No. 13
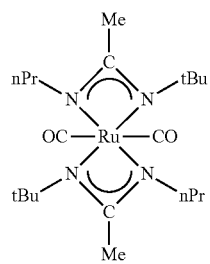
Compound No. 14
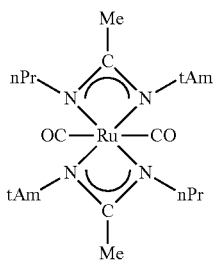
Compound No. 15
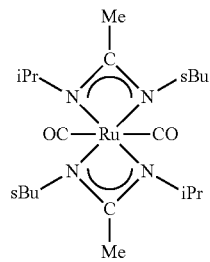
Compound No. 16
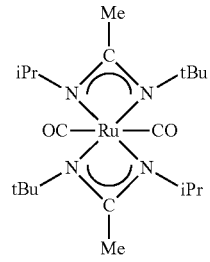
Compound No. 17
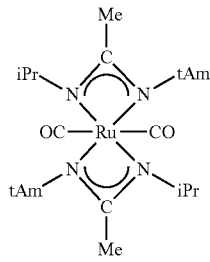
Compound No. 18

Compound No. 19
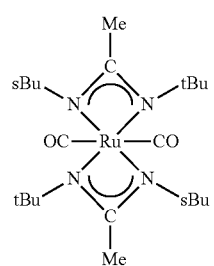
Compound No. 20
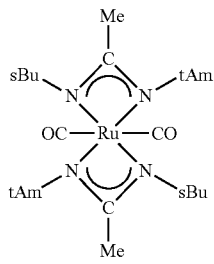
Compound No. 21
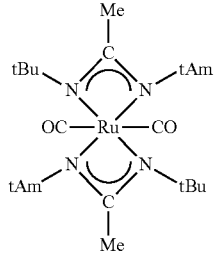
Compound No. 22
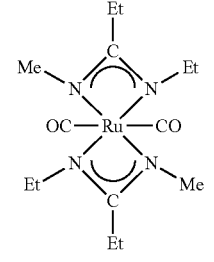
Compound No. 23
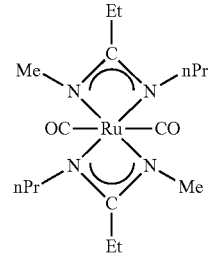
Compound No. 24
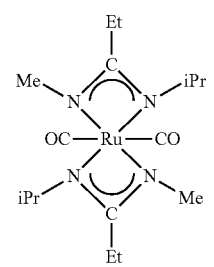
Compound No. 25
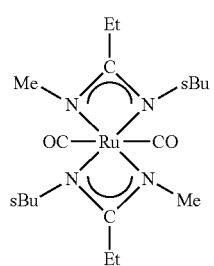
Compound No. 26
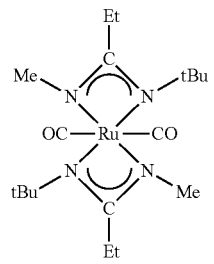
Compound No. 27
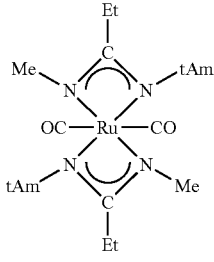
Compound No. 28
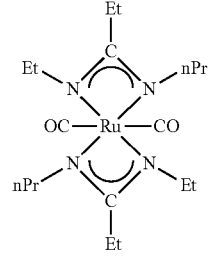
Compound No. 29
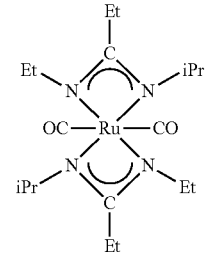
Compound No. 30
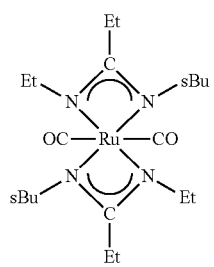

-continued
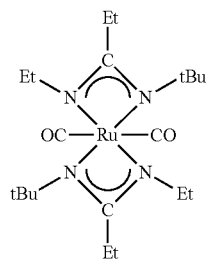
Compound No. 31
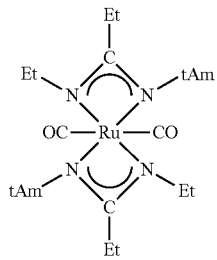
Compound No. 32
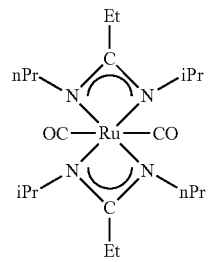
Compound No. 33
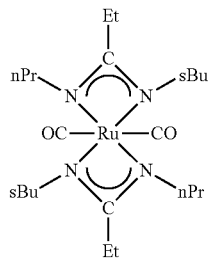
Compound No. 34
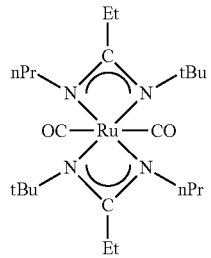
Compound No. 35
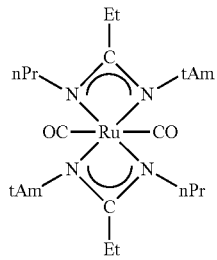
Compound No. 36
-continued
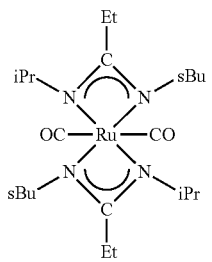
Compound No. 37
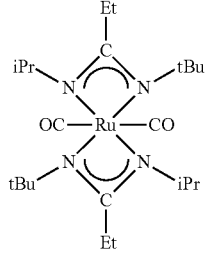
Compound No. 38
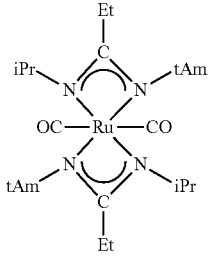
Compound No. 39
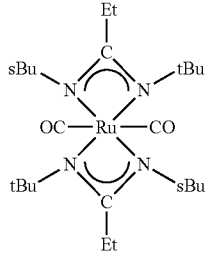
Compound No. 40
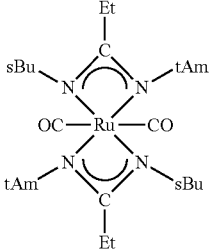
Compound No. 41
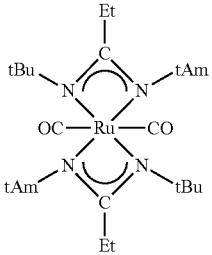
Compound No. 42

Compound No. 43
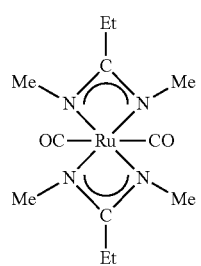
Compound No. 44
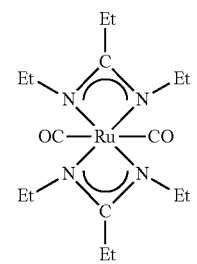
Compound No. 45
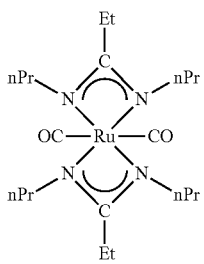
Compound No. 46
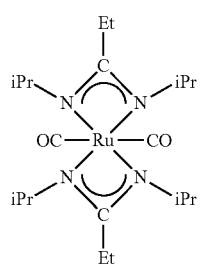
Compound No. 47
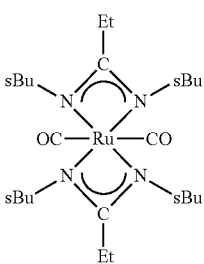
Compound No. 48
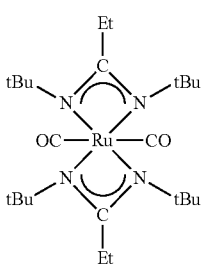
Compound No. 49
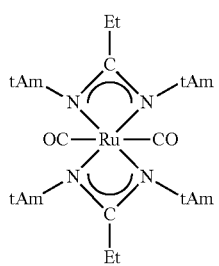
Compound No. 50
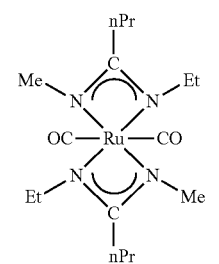
Compound No. 51
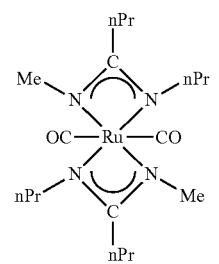
Compound No. 52
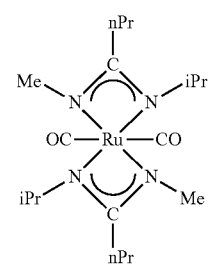
Compound No. 53
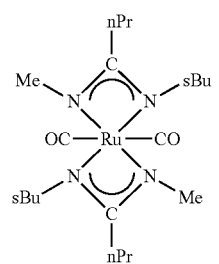
Compound No. 54

13
-continued
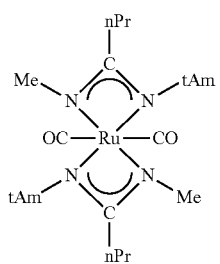
Compound No. 55
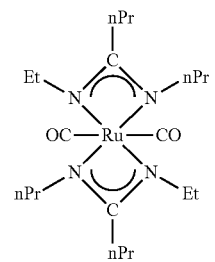
Compound No. 56
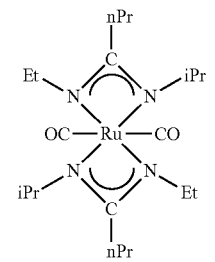
Compound No. 57
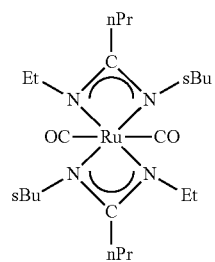
Compound No. 58
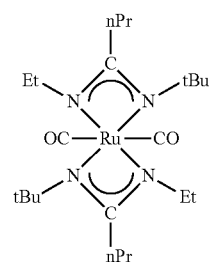
Compound No. 59
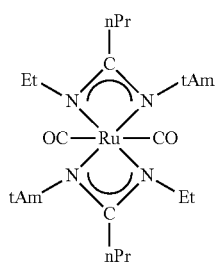
Compound No. 60
14
-continued
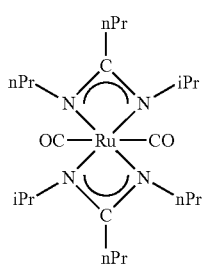
Compound No. 61
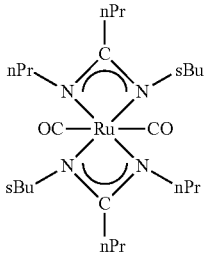
Compound No. 62
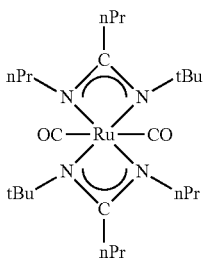
Compound No. 63
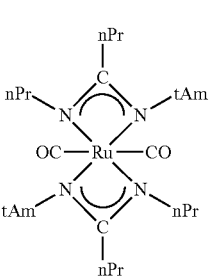
Compound No. 64
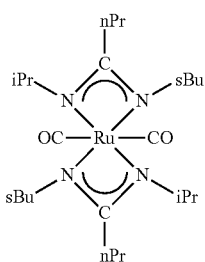
Compound No. 65
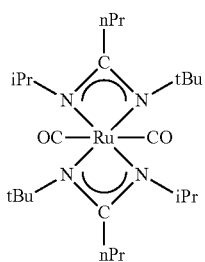
Compound No. 66

Compound No. 67
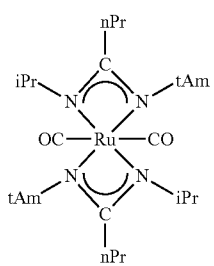
Compound No. 68
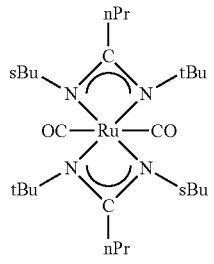
Compound No. 69
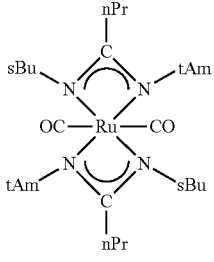
Compound No. 70
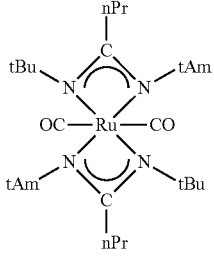
Compound No. 71
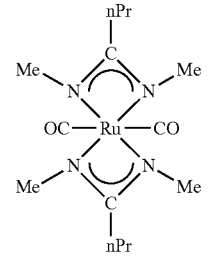
Compound No. 72
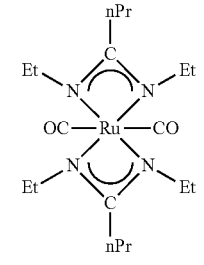
Compound No. 73
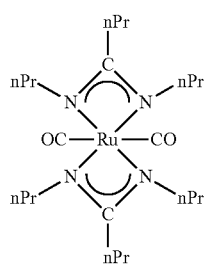
Compound No. 74
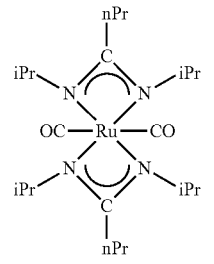
Compound No. 75
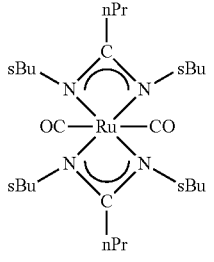
Compound No. 76
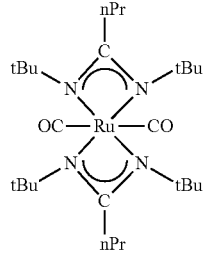
Compound No. 77
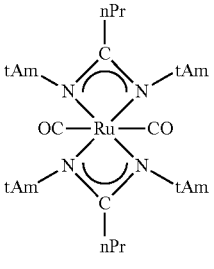
Compound No. 78
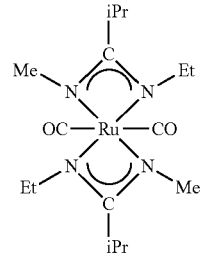

Compound No. 79
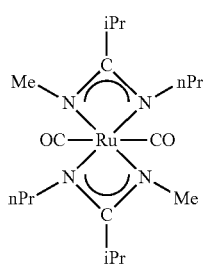
Compound No. 80
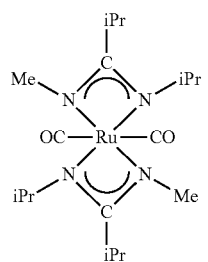
Compound No. 81
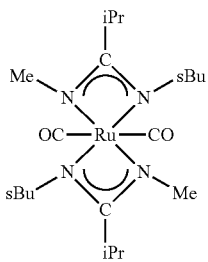
Compound No. 82
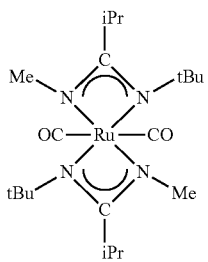
Compound No. 83
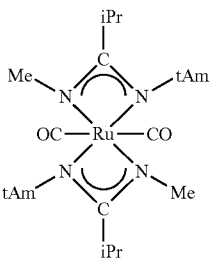
Compound No. 84
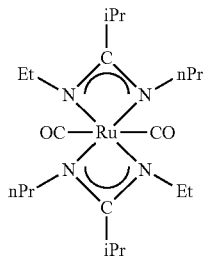
Compound No. 85
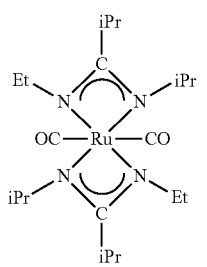
Compound No. 86
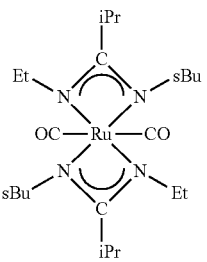
Compound No. 87
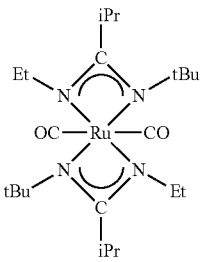
Compound No. 88
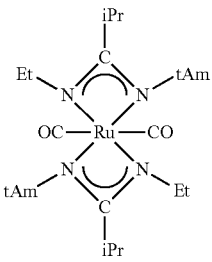
Compound No. 89
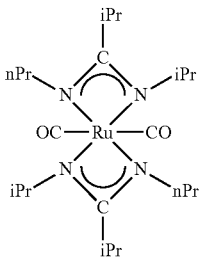
Compound No. 90
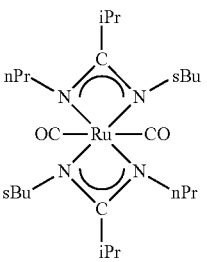

Compound No. 91
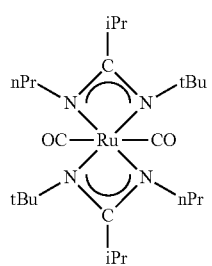
Compound No. 92
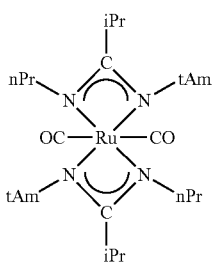
Compound No. 93
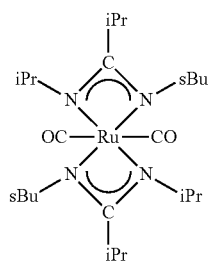
Compound No. 94
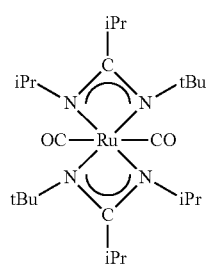
Compound No. 95
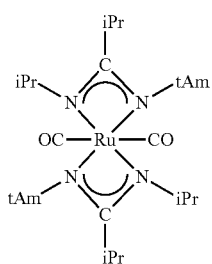
Compound No. 96
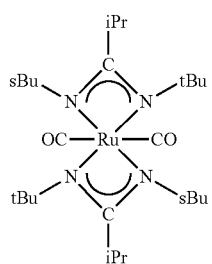
Compound No. 97
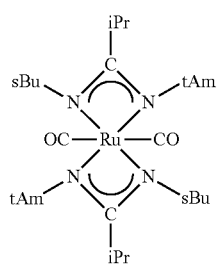
Compound No. 98
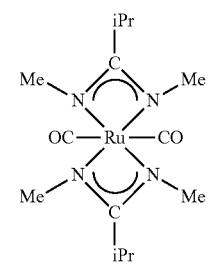
Compound No. 99
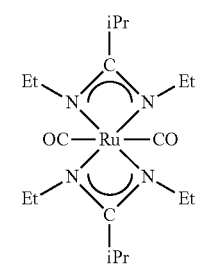
Compound No. 100
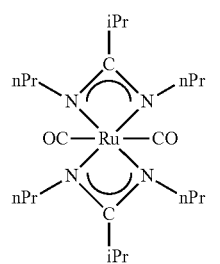
Compound No. 101
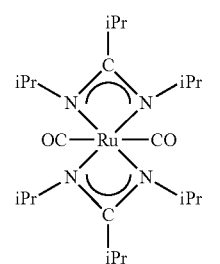
Compound No. 102
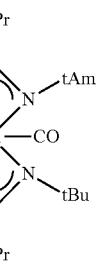

Compound No. 103
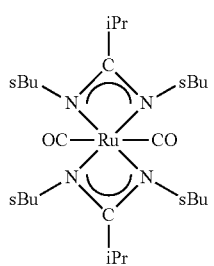
Compound No. 104
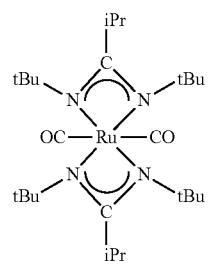
Compound No. 105
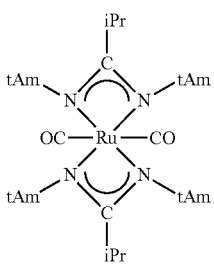
Compound No. 106
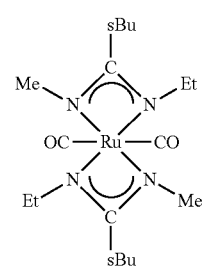
Compound No. 107
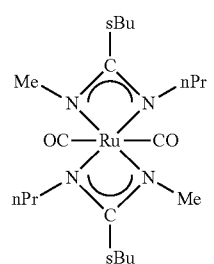
Compound No. 108
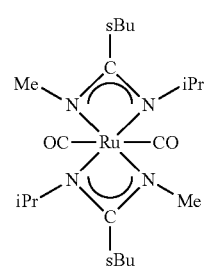
Compound No. 109
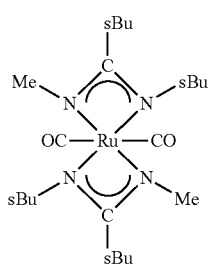
Compound No. 110
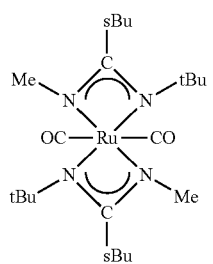
Compound No. 111
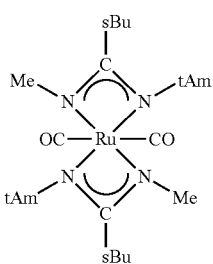
Compound No. 112
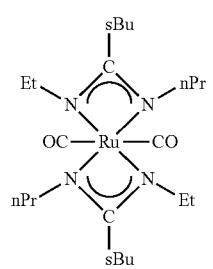
Compound No. 113
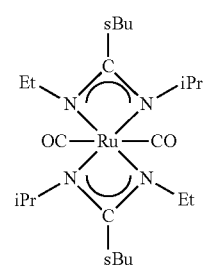
Compound No. 114
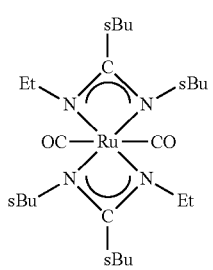

Compound No. 115
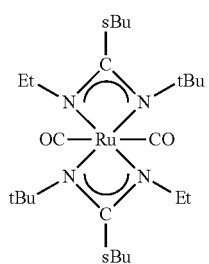
Compound No. 116
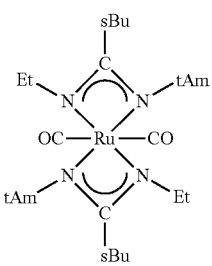
Compound No. 117
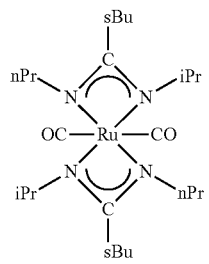
Compound No. 118
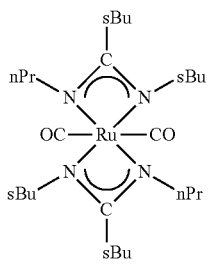
Compound No. 119
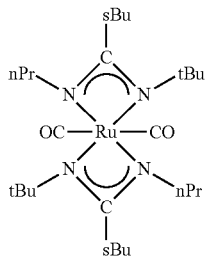
Compound No. 120
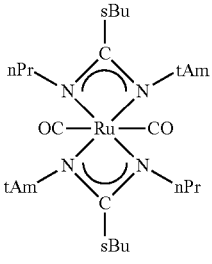
Compound No. 121
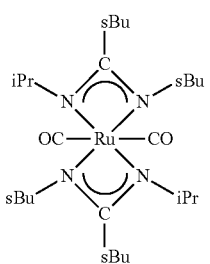
Compound No. 122
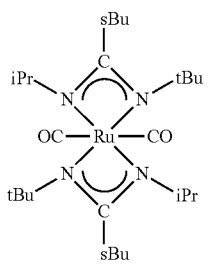
Compound No. 123
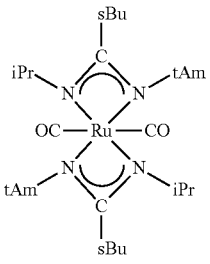
Compound No. 124
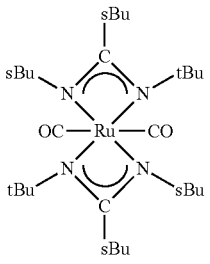
Compound No. 125
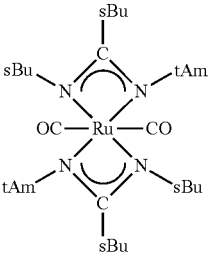
Compound No. 126
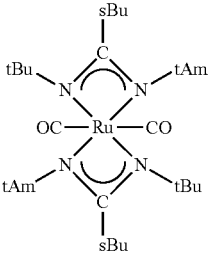

Compound No. 127
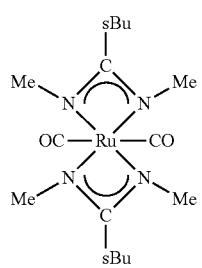
Compound No. 128
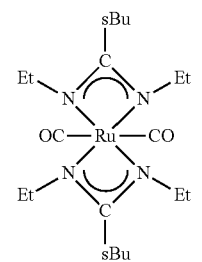
Compound No. 129
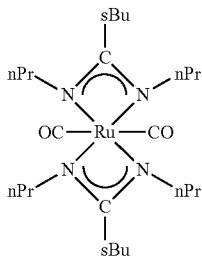
Compound No. 130
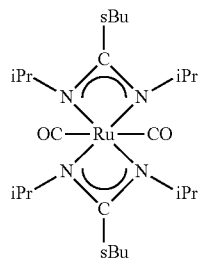
Compound No. 131
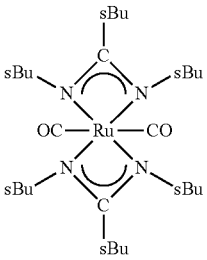
Compound No. 132
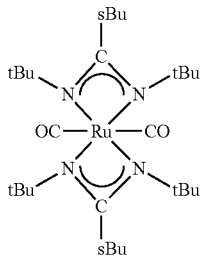
Compound No. 133
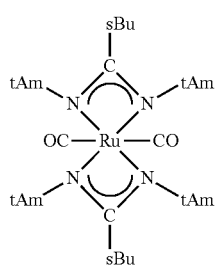
Compound No. 134
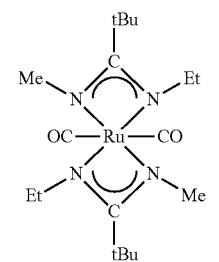
Compound No. 135
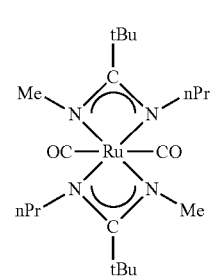
Compound No. 136
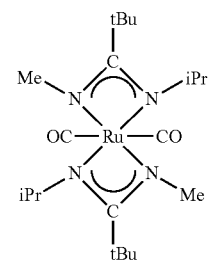
Compound No. 137
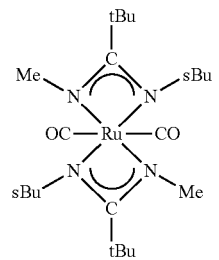
Compound No. 138
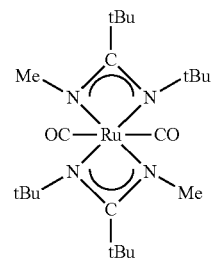

Compound No. 139
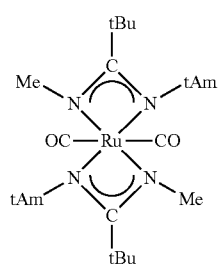
Compound No. 140
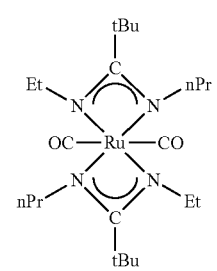
Compound No. 141
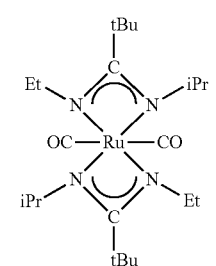
Compound No. 142
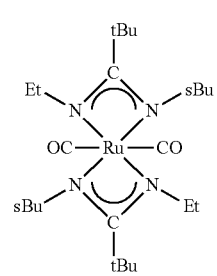
Compound No. 143
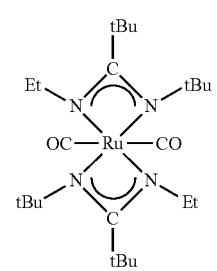
Compound No. 144
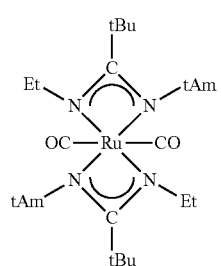
Compound No. 145
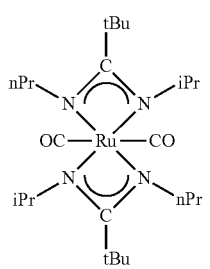
Compound No. 146
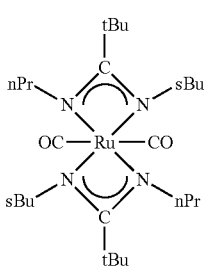
Compound No. 147
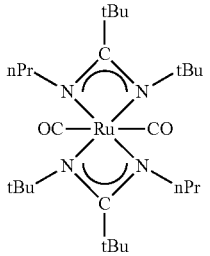
Compound No. 148
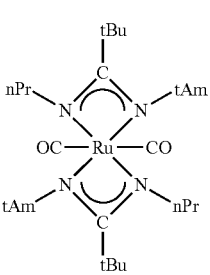
Compound No. 149
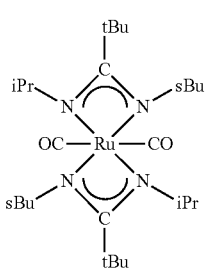
Compound No. 150
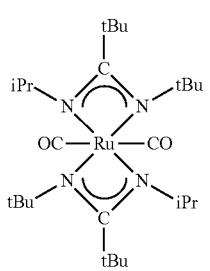

Compound No. 151
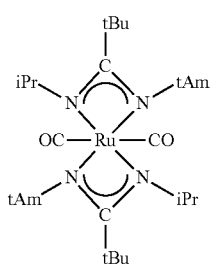
Compound No. 152
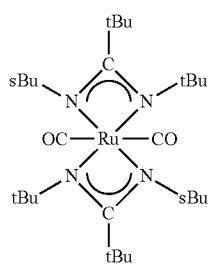
Compound No. 153
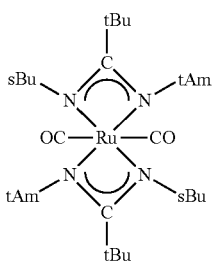
Compound No. 154
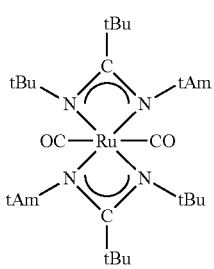
Compound No. 155
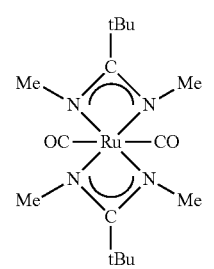
Compound No. 156
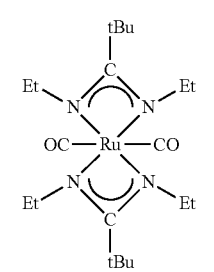
Compound No. 157
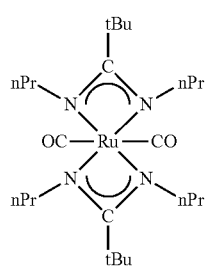
Compound No. 158
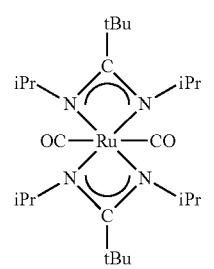
Compound No. 159
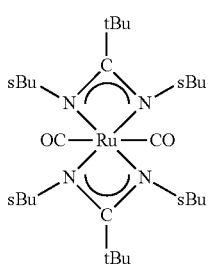
Compound No. 160
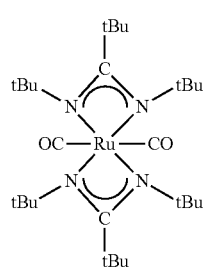
Compound No. 161
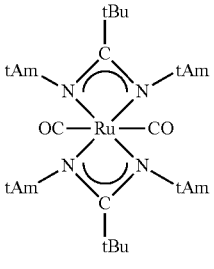
Compound No. 162
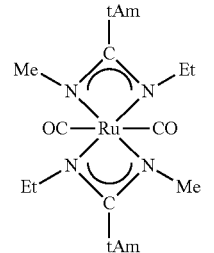

Compound No. 163
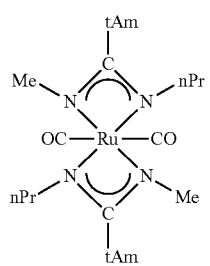
Compound No. 164
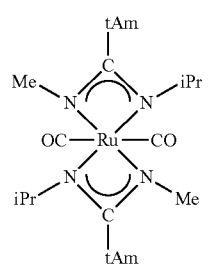
Compound No. 165
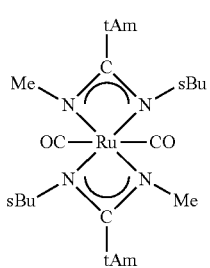
Compound No. 166
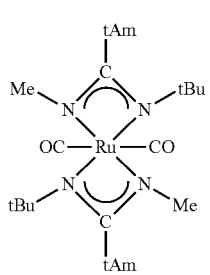
Compound No. 167
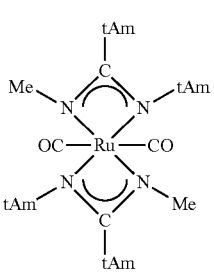
Compound No. 168
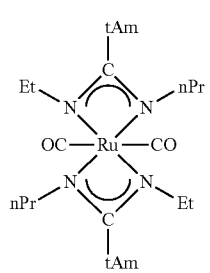
Compound No. 169
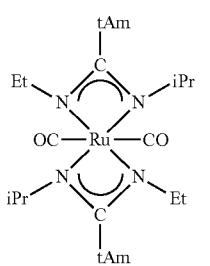
Compound No. 170
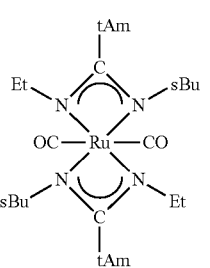
Compound No. 171
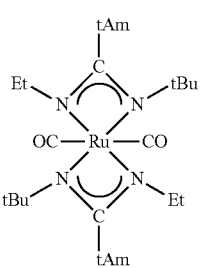
Compound No. 172
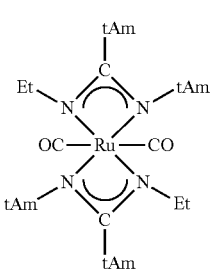
Compound No. 173
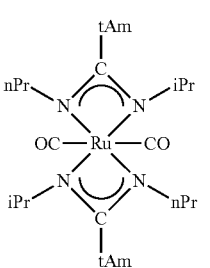
Compound No. 174
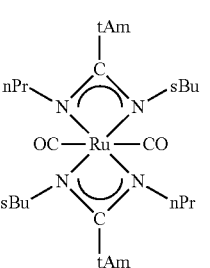

Compound No. 175
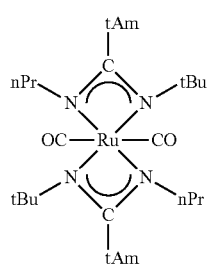
Compound No. 176
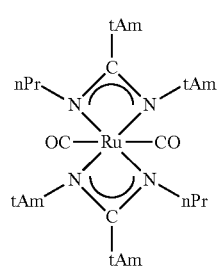
Compound No. 177
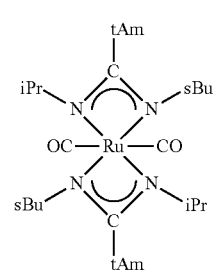
Compound No. 178
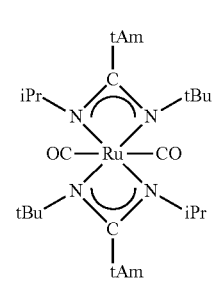
Compound No. 179
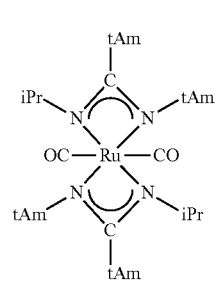
Compound No. 180
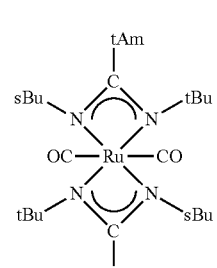
Compound No. 181
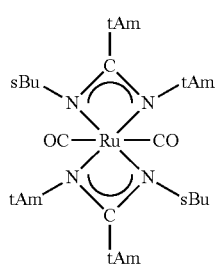
Compound No. 182
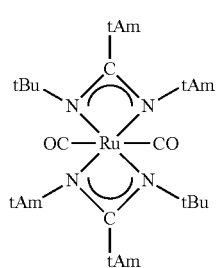
Compound No. 183
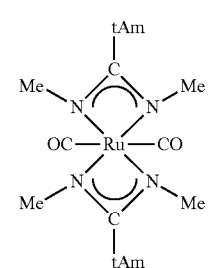
Compound No. 184
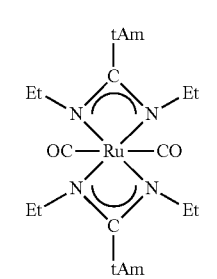
Compound No. 185
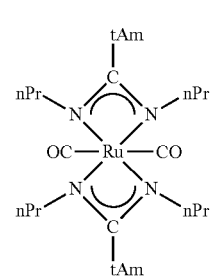
Compound No. 186
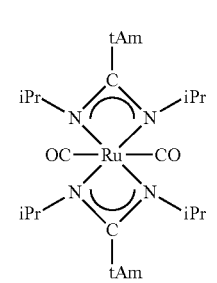

Compound No. 187
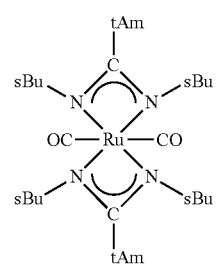
Compound No. 188
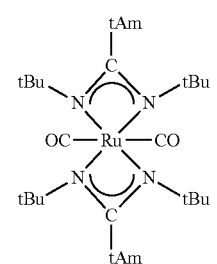
Compound No. 189
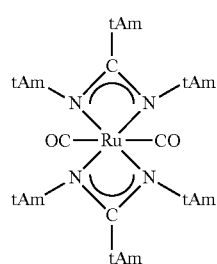
Compound No. 190
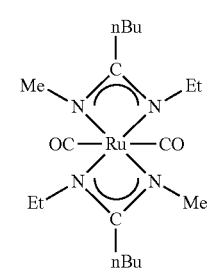
Compound No. 191
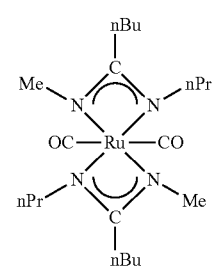
Compound No. 192
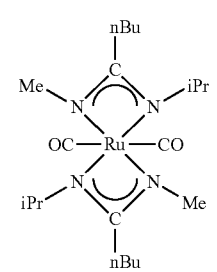
Compound No. 193
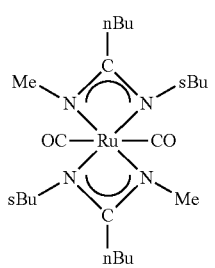
Compound No. 194
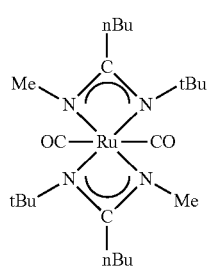
Compound No. 195
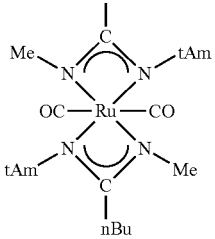
Compound No. 196
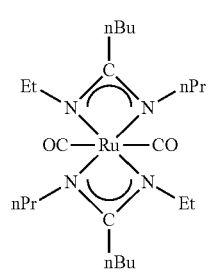
Compound No. 197
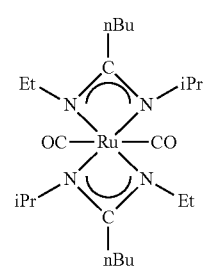
Compound No. 198
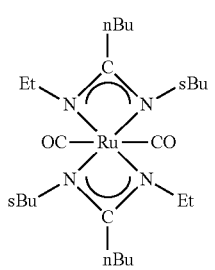

Compound No. 199
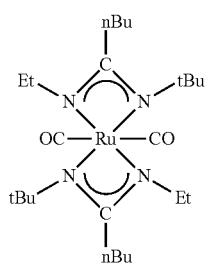
Compound No. 200
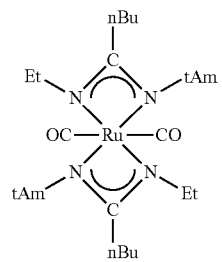
Compound No. 201
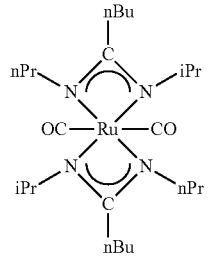
Compound No. 202
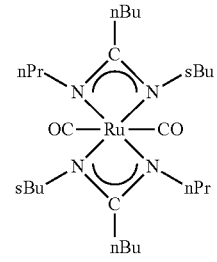
Compound No. 203
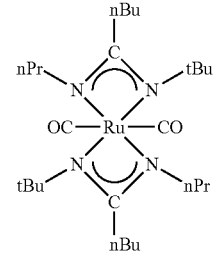
Compound No. 204
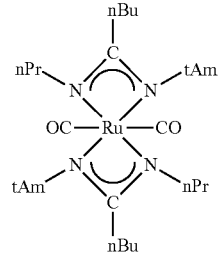
Compound No. 205
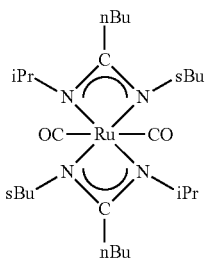
Compound No. 206
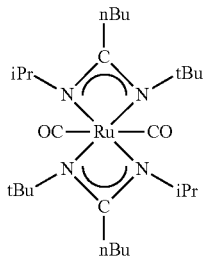
Compound No. 207
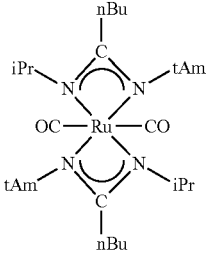
Compound No. 208
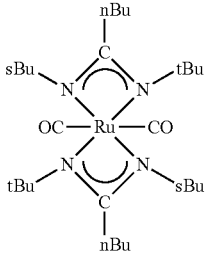
Compound No. 209
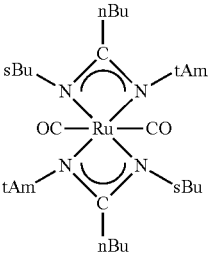
Compound No. 210
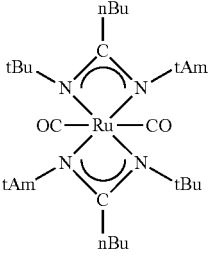

Compound No. 211

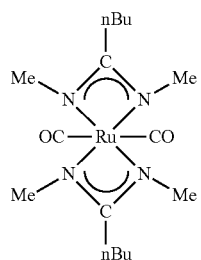

Compound No. 212

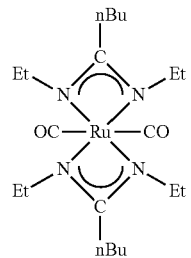

Compound No. 213

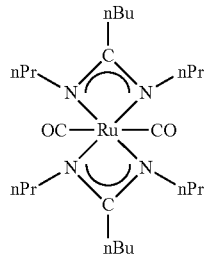

Compound No. 214

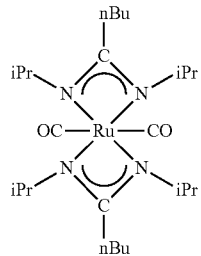

Compound No. 215

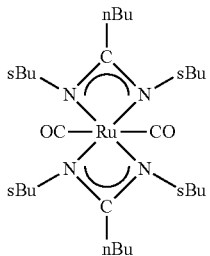

Compound No. 216

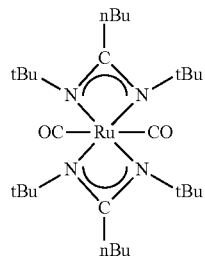

Compound No. 217

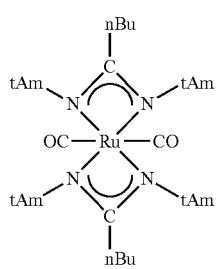

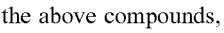

Among the above compounds, Compounds Nos. 10, 31, 46, 74, and 214 are preferable, and Compounds Nos. 10, 31 and 214 are more preferable because they have a low melting point. In addition, in consideration of vapor pressure, Compounds No. 10 and No. 31 are preferable.

A method of producing the ruthenium compound of the present invention is not particularly limited, and the ruthenium compound can be obtained by a reaction of a well-known carbonium ruthenium compound represented by ruthenium tricarbonyl dichloride or dodecacarbonium triruthenium with an amidine compound having a corresponding structure or an alkali metal salt of an amidine compound having a corresponding structure.

Next, the raw material for forming a thin film of the present invention includes the ruthenium compound of the present invention described above as a precursor of a thin film, and its form differs depending on a production process in which the raw material for forming a thin film is applied. For example, when a thin film containing only ruthenium as a metal is produced, the raw material for forming a thin film of the present invention does not contain a metal compound other than the ruthenium compound of the present invention and a semi-metal compound. Meanwhile, when a thin film containing two or more metals and/or semi-metals is produced, the raw material for forming a thin film of the present invention can contain, in addition to the ruthenium compound of the present invention, a compound containing a desired metal and/or a compound containing a semi-metal (hereinafter also referred to as "other precursors"). As will be described below, the raw material for forming a thin film of the present invention may further contain an organic solvent and/or a nucleophilic reagent. The raw material for forming a thin film of the present invention is particularly useful as a raw material for chemical vapor deposition (hereinafter also referred to as "raw material for CVD") because, as described above, physical properties of the ruthenium compound of the present invention as a precursor are suitable for a CVD method and an ALD method.

When the raw material for forming a thin film of the present invention is a raw material for chemical vapor deposition, its form is appropriately selected according to a method such as a transport supply method in the CVD method used or the like.

Regarding the transport supply method, a gas transport method in which a raw material for CVD is vaporized into a vapor by being heated and/or depressurized in a container in which the raw material is stored (hereinafter also referred to as a "raw material container"), and together with a carrier gas such as argon, nitrogen, and helium used as necessary, the vapor is introduced into a film-forming chamber in which a substrate is provided (hereinafter referred to as a "deposition reaction unit") and a liquid transport method in which a raw material for CVD in a liquid or solution state is transported to a vaporization chamber and is vaporized into a vapor by being heated and/or depressurized in the vaporization chamber, and the vapor is introduced into a film-forming chamber may be exemplified. In the case of the gas transport method, the ruthenium compound represented by general formula (1) can be directly used as a raw material for CVD. In the case of the liquid transport method, the ruthenium compound represented by general formula (1) or a solution in which the compound is dissolved in an organic solvent can be used as a raw material for CVD. Such a raw material for CVD may further contain other precursors, a nucleophilic reagent, and the like.

In addition, in the multi-component CVD method, a method in which components in a raw material for CVD are independently vaporized and supplied (hereinafter also referred to as a "single source method") and a method in which mixed raw materials in which multiple component raw materials are mixed in a desired composition in advance are vaporized and supplied (hereinafter also referred to as a "cocktail source method") are used. In the case of the cocktail source method, a mixture containing the ruthenium compound of the present invention and other precursors or a mixed solution in which the mixture is dissolved in an organic solvent can be used as a raw material for CVD. The mixture or mixed solution may further contain a nucleophilic reagent and the like.

Regarding the organic solvent, a well-known, general organic solvent can be used without any particular limitation. Examples of organic solvents include acetate esters such as ethyl acetate, butyl acetate, and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methyl cyclohexanone; hydrocarbons such as hexane, cyclohexane, methylcyclohexane, dimethylcyclohexane, ethylcyclohexane, heptane, octane, toluene, and xylene; hydrocarbons having a cyano group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine, and lutidine. These may be used alone or as a solvent in which two or more thereof are mixed depending on the solubility of a solute, and the relationships between operation temperature, boiling point, flash point, and the like.

When such an organic solvent is used, preferably, the total amount of the precursors in a raw material for CVD, which is a solution in which the precursors are dissolved in the organic solvent, is 0.01 mol/L to 2.0 mol/L, and particularly 0.05 mol/L to 1.0 mol/L. When the raw material for forming a thin film of the present invention does not contain a metal compound and a semi-metal compound other than the ruthenium compound of the present invention, the total amount of the precursors is the amount of the ruthenium compound of the present invention, and when the raw material for forming a thin film of the present invention contains a compound containing another metal in addition to the ruthenium compound and/or a compound containing a semi-metal, the total amount of the precursors is the total amount of the ruthenium compound of the present invention and other precursors.

In addition, in the case of the multi-component CVD method, regarding other precursors to be used together with the ruthenium compound of the present invention, a well-known, general precursor used in a raw material for CVD can be used without any particular limitation.

Regarding other precursors described above, compounds including one, two, or more selected from the group consisting of compounds used as organic ligands such as an alcohol compound, a glycol compound, a 3-diketone compound, a cyclopentadiene compound and an organic amine compound, and silicon or a metal may be exemplified. In addition, examples of types of metal precursors include lithium, sodium, potassium, magnesium, calcium, strontium, barium, titanium, zirconium, hafnium, vanadium, niobium, tantalum, chromium, molybdenum, tungsten, manganese, iron, ruthenium, cobalt, rhodium, iridium, nickel, palladium, platinum, copper, silver, gold, zinc, aluminum, gallium, indium, germanium, tin, lead, antimony, bismuth, scandium, yttrium, lanthanum, cerium, praseodymium, neodymium, promethium, samarium, europium, gadolinium, terbium, dysprosium, holmium, erbium, thulium, ytterbium and lutetium.

Examples of an alcohol compound used as an organic ligand for other precursors described above include alkyl alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols such as dimethylaminoethanol, ethylmethylaminoethanol, diethylaminoethanol, dimethylamino-2-pentanol, ethylmethylamino-2-pentanol, dimethylamino-2-methyl-2-pentanol, ethyl methylamino-2-methyl-2-pentanol, and diethylamino-2-methyl-2-pentanol.

Examples of a glycol compound used as an organic ligand for other precursors described above include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

In addition, examples of 3-diketone compounds used as an organic ligand for other precursors described above include alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

In addition, examples of a cyclopentadiene compound used as an organic ligand for other precursors described above include cyclopentadiene, methylcyclopentadiene, ethylcyclopentadiene, propylcyclopentadiene, isopropyl cyclopentadiene, butyl cyclopentadiene, sec-butylcyclopentadiene, isobutylcyclopentadiene, tert-butyl cyclopentadiene, dimethylcyclopentadiene, and tetramethylcyclopentadiene.

Examples of an organic amine compound used as an organic ligand for the precursors other than the ones above include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The other precursors described above are known in the related art and methods of producing same are also known. Regarding a production method example, for example, when an alcohol compound is used as an organic ligand, an inorganic salt of a metal as described above, or its hydrates is reacted with an alkali metal alkoxide of the alcohol compound, and thereby a precursor can be produced. Here, examples of inorganic salts of metals or their hydrates include metal halides and nitrates, and examples of alkali metal alkoxides include sodium alkoxides, lithium alkoxides, and potassium alkoxides.

In the case of a single source method, other precursors described above are preferably compounds having a similar thermal and/or oxidative decomposition behavior to those of the ruthenium compound of the present invention, and in the case of a cocktail source method, a compound that has a similar thermal and/or oxidative decomposition behavior and also does not cause deterioration due to a chemical reaction or the like during mixing is preferable.

In addition, the raw material for forming a thin film of the present invention may contain, as necessary, a nucleophilic reagent for imparting stability to the ruthenium compound of the present invention and other precursors. Examples of nucleophilic reagents include ethylene glycol ethers such as glyme, diglyme, triglyme, and tetraglyme, crown ethers such as 18-crown-6, dicyclohexyl-18-crown-6,24-crown-8, dicyclohexyl-24-crown-8, and dibenzo-24-crown-8, polyamines such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine, cyclic polyamines such as cyclam and cyclen, heterocyclic compounds such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane, β-ketoesters such as methyl acetoacetate, ethyl acetoacetate and 2-methoxyethyl acetoacetate, and β-diketones such as acetylacetone, 2,4-hexanedione, 2,4-heptanedione, 3,5-heptanedione, and dipivaloylmethane. An amount of such a nucleophilic reagent used is preferably in a range of 0.1 mol to 10 mol and more preferably in a range of 1 mol to 4 mol with respect to 1 mol of a total amount of the precursors.

In the raw material for forming a thin film of the present invention, impurity metal element content, impurity halogen content such as chlorine impurities, and organic impurity components other than components constituting the same are minimized. The impurity metal element content is preferably 100 ppb or less and more preferably 10 ppb or less for each element, and the total amount thereof is preferably 1 ppm or less and more preferably 100 ppb or less. In particular, when used as a gate insulating film, a gate film, or a barrier layer of an LSI, it is necessary to reduce the content of alkali metal elements and alkaline earth metal elements which affect electrical characteristics of the obtained thin film. The impurity halogen content is preferably 100 ppm or less, more preferably 10 ppm or less, and most preferably 1 ppm or less. The total amount of organic impurity components is preferably 500 ppm or less, more preferably 50 ppm or less, and most preferably 10 ppm or less. In addition, since water causes generation of particles in the raw material for chemical vapor deposition and generation of particles during thin film formation, in order to reduce the amount of water in each of the precursor, the organic solvent, and the nucleophilic reagent, it is preferable to remove as much water as possible before use. The amount of water in each of the precursor, the organic solvent, and the nucleophilic reagent is preferably 10 ppm or less and more preferably 1 ppm or less.

In addition, in the raw material for forming a thin film of the present invention, in order to reduce the amount of or prevent particle contaminants in the formed thin film, it is preferable that as few particles as possible be contained. Specifically, in measurement of particles by a particle detector in a light scattering liquid in a liquid phase, the number of particles larger than 0.3 μm is preferably 100 or fewer in 1 mL of a liquid phase, the number of particles larger than 0.2 μm is more preferably 1,000 or fewer in 1 mL of a liquid phase, and the number of particles larger than 0.2 μm is most preferably 100 or fewer in 1 mL of a liquid phase.

The method of producing a thin film of the present invention in which a thin film is produced using the raw material for forming a thin film of the present invention is a CVD method in which a vapor obtained by vaporizing the raw material for forming a thin film of the present invention and a reactive gas used as necessary are introduced into a film-forming chamber in which a substrate is provided (processing atmosphere), and next, a precursor is decomposed and/or chemically reacted on the substrate and a metal-containing thin film grows and is deposited on the surface of the substrate. Regarding raw material transport supply methods, deposition methods, production conditions, production devices, and the like, well-known, general conditions and methods can be used without any particular limitation.

Examples of reactive gases used as necessary include oxygen, ozone, nitrogen dioxide, nitrogen monoxide, water vapor, hydrogen peroxide, formic acid, acetic acid, and acetic anhydride which have oxidizability and hydrogen which has reducibility, and examples of those for producing nitrides include organic amine compounds such as monoalkylamines, dialkylamines, trialkylamines and alkylenediamines, hydrazine, and ammonia. One, two, or more thereof can be used. Among these, since the raw material for forming a thin film of the present invention then has favorable reactivity with ozone, when one reactive gas is used, ozone is preferably used, and when a gas in which two or more thereof are mixed is used as a reactive gas, it is preferable to include at least ozone.

In addition, examples of transport supply methods include the gas transport method, liquid transport method, single source method, and cocktail source method described above.

In addition, examples of deposition methods include thermal CVD in which a thin film is deposited by a reaction of a raw material gas or a reaction of a raw material gas with a reactive gas only by heating, plasma CVD using heat and plasma, photo CVD using heat and light, photo plasma CVD using heat, light and plasma, and ALD in which a CVD deposition reaction is divided into elementary processes and stepwise deposition is performed at the molecular level.

Examples of materials of the substrate include silicon; ceramics such as silicon nitride, titanium nitride, tantalum nitride, titanium oxide, titanium nitride, ruthenium oxide, zirconium oxide, hafnium oxide, and lanthanum oxide; glass; and metals such as metal cobalt. Examples of shapes of the substrate include plate shapes, spherical shapes, fibrous shapes, and scaly shapes. The surface of the substrate may be flat or may have a three-dimensional structure such as a trench structure.

In addition, the production conditions include reaction temperature (substrate temperature), reaction pressure, deposition rate, and the like. The reaction temperature is preferably 100° C. or higher which is a temperature at which the compound of the present invention sufficiently reacts, and more preferably 150° C. to 400° C., and particularly preferably 200° C. to 350° C. In addition, the reaction pressure is preferably 10 Pa to atmospheric pressure in the case of thermal CVD or photo CVD, and is preferably 10 Pa to 2,000 Pa when a plasma is used.

In addition, the deposition rate can be controlled according to raw material supply conditions (vaporization temperature, vaporization pressure), reaction temperature, and reaction pressure. The deposition rate is preferably 0.01 nm/min to 100 nm/min and more preferably 1 nm/min to 50 nm/min because characteristics of the obtained thin film may deteriorate if the deposition rate is large and problems may occur in productivity if the deposition rate is small. In addition, in the ALD method, the number of cycles is controlled to obtain a desired film thickness.

The production conditions further include a temperature and pressure at which the raw material for forming a thin film is vaporized into a vapor. A process of obtaining a vapor by vaporizing the raw material for forming a thin film may be performed in the raw material container or in the vaporization chamber. In any case, the raw material for forming a thin film of the present invention is preferably evaporated at 0° C. to 150° C. In addition, when a vapor is obtained by vaporizing the raw material for forming a thin film in the raw material container or the vaporization chamber, the pressure in the raw material container and the pressure in the vaporization chamber are both preferably 1 Pa to 10,000 Pa.

The method of producing a thin film of the present invention adopts an ALD method, and may include, in addition to a raw material introducing process in which the raw material for forming a thin film is vaporized into a vapor, and the vapor is introduced into a film-forming chamber by a transport supply method, a precursor thin film forming process in which a precursor thin film is formed on the surface of the substrate using a compound in the vapor, an exhaust process in which unreacted gas compounds are exhausted, and a metal-containing thin film forming process in which the precursor thin film is chemically reacted with a reactive gas to form a metal-containing thin film on the surface of the substrate.

Hereinafter, respective processes of the ALD method will be described in detail using a case in which a metal oxide thin film is formed as an example. First, the above raw material introducing process is performed. A preferable temperature and pressure when the raw material for forming a thin film is vaporized are the same as those described in the method of producing a thin film according to the CVD method. Next, the vapor introduced into the film-forming chamber is brought into contact with the surface of the substrate, and thereby a precursor thin film is formed on the surface of the substrate (precursor thin film forming process). In this case, the substrate may be heated or the film-forming chamber may be heated to apply heat. The precursor thin film formed in this process is a thin film formed from the compound of the present invention or a thin film formed by decomposition and/or reaction of a part of the compound of the present invention, and has a composition different from that of a desired metal oxide thin film. The substrate temperature when this process is performed is preferably room temperature to 500° C. and more preferably 150° C. to 350° C. The pressure of the system (in the film-forming chamber) in which this process is performed is preferably 1 Pa to 10,000 Pa and more preferably 10 Pa to 1,000 Pa.

Next, unreacted gas compounds and byproduct gases are exhausted from the film-forming chamber (exhaust process). The unreacted gas compounds and byproduct gases should ideally be completely exhausted from the film-forming chamber, but do not need to be completely exhausted. Examples of an exhaust method include a method in which the inside of the system is purged with an inert gas such as nitrogen, helium, or argon, a method of exhausting by reducing the pressure in the system, and a combination method thereof. When the pressure is reduced, the degree of pressure reduction is preferably 0.01 Pa to 300 Pa and more preferably 0.01 Pa to 100 Pa.

Next, an oxidizing gas is introduced into the film-forming chamber as a reactive gas, and a metal oxide thin film is formed from the precursor thin film obtained in the previous precursor thin film forming process according to the action of the oxidizing gas or the action of the oxidizing gas and heat (metal-oxide-containing thin film forming process). A temperature when heat is applied in this process is preferably room temperature to 500° C. and more preferably 150° C. to 350° C. The pressure in the system (in the film-forming chamber) in which this process is performed is preferably 1 Pa to 10,000 Pa and more preferably 10 Pa to 1,000 Pa. Since the compound of the present invention has favorable reactivity with an oxidizing gas, it is possible to obtain a metal oxide thin film having a small residual carbon content and high quality.

In the method of producing a thin film of the present invention, when the above ALD method is adopted, thin film deposition according to a series of operations including the above raw material introducing process, precursor thin film forming process, exhaust process and metal-oxide-containing thin film forming process is set as one cycle, and this cycle may be repeated a plurality of times until a thin film with a required film thickness is obtained. In this case, after one cycle is performed, in the same manner as in the exhaust process, unreacted gas compounds and reactive gases (an oxidizing gas when a metal oxide thin film is formed), and additionally preferably, byproduct gases are exhausted from the deposition reaction site and the next cycle is then performed.

In addition, in formation of a metal oxide thin film according to the ALD method, energy such as that in plasma, light, and voltage may be applied or a catalyst may be used. The time at which the energy is applied and the time at which a catalyst is used are not particularly limited. The time may be, for example, during introduction of a compound gas in the raw material introducing process, during heating in the precursor thin film forming process or in the metal-oxide-containing thin film forming process, during exhausting of the system in the exhaust process, or during introduction of an oxidizing gas in the metal-oxide-containing thin film forming process, or may be between these processes.

In addition, in the method of producing a thin film of the present invention, after thin film deposition, in order to obtain more favorable electrical characteristics, an annealing treatment may be performed under an inert atmosphere, an oxidizing atmosphere or a reducing atmosphere, or a reflow process may be provided when step coverage is necessary. The temperature in this case is 200° C. to 1,000° C., and preferably 250° C. to 500° C.

Figure 2:
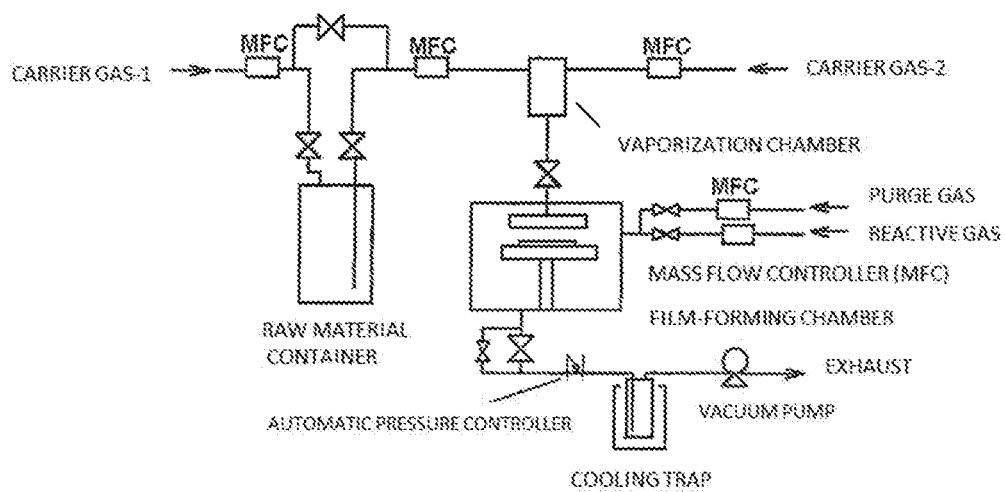
FIG. 2 is a schematic view showing another example of the chemical vapor deposition device used in the method of producing a thin film according to the present invention.
Figure 3:
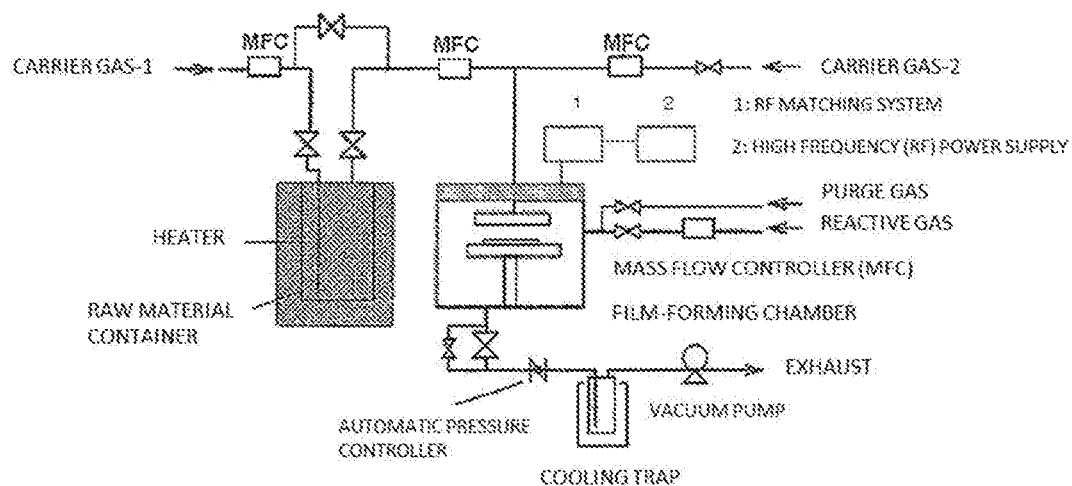
FIG. 3 is a schematic view showing still another example of the chemical vapor deposition device used in the method of producing a thin film according to the present invention.
Figure 4:
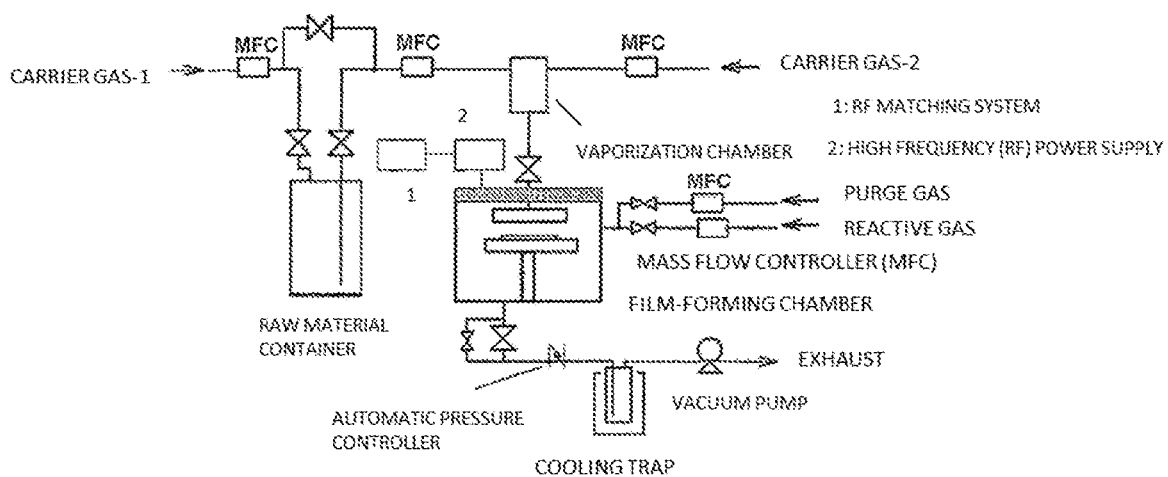
FIG. 4 is a schematic view showing yet another example of the chemical vapor deposition device used in the method of producing a thin film according to the present invention.

Regarding a device for producing a thin film using the raw material for forming a thin film of the present invention, a well-known chemical vapor deposition device can be used. Specific examples of devices include a device that can perform bubbling supply of a precursor as shown in FIG. 1 and a device having a vaporization chamber as shown in FIG. 2. In addition, a device that can perform a plasma treatment on a reactive gas as shown in FIG. 3 and FIG. 4 may be exemplified. Here, a device that can simultaneously process a plurality of wafers using a batch furnace can be used without limitation in addition to a single-wafer type device as shown in FIG. 1 to FIG. 4.

A thin film produced using the raw material for forming a thin film of the present invention can be made into a thin film of a desired type such as a metal, an oxide ceramic, a nitride ceramic, and a glass by appropriately selecting other precursors, reactive gases and production conditions. It is known that the thin film exhibits certain electrical characteristics, optical characteristics, and the like, and is applied in various applications. Examples thereof include a metal ruthenium thin film, a ruthenium oxide thin film, and a ruthenium-alloy- and ruthenium-containing composite oxide thin film. Examples of ruthenium alloys include a Pt—Ru alloy. Examples of a ruthenium-containing composite oxide thin film include $SrRuO_3$. Such a thin film is widely used for producing, for example, an electrode material of a memory element represented by a DRAM element, a resistive film, a diamagnetic film used for a recording layer of a hard disk, a catalyst material for a solid polymer fuel cell, and the like.

EXAMPLES

Hereinafter, the present invention will be described in more detail with reference to examples, production examples, comparative examples, and evaluation examples. However, the present invention is not limited to the following examples and the like.

[Example 1] Synthesis of Compound No. 10

16 g of N'-(tert-butyl)-N-ethylacetimidoamide and 225 mL of dehydrated THF were put into a reaction flask and sufficiently mixed. 72.6 mL of an n-butyllithium hexane solution (1.55 M) was added dropwise to the obtained solution under ice-cooling, and stirred for 1 hour. 13.1 g of ruthenium tricarbonyl dichloride and 511 mL of dehydrated THF were put into a separately prepared reaction flask, and sufficiently mixed and then the above-described reaction solution was added dropwise thereto under ice-cooling. The reaction solution was stirred at room temperature for 15 hours and then heated to reflux at 80° C. for 4 hours. After stirring, the temperature was returned to room temperature and filtering was performed. In the obtained filtrate, the solvent was removed in an oil bath at 75° C. under a reduced pressure. The obtained ruthenium complex was distilled in an oil bath at 135° C. and at 13 Pa, and thereby 6.41 g of a bright yellow viscous liquid was obtained.

(Analysis Values)
(1) Atmospheric pressure TG-DTA
Mass 50% reduction temperature: 216° C. (760 Torr, Ar flow rate: 100 ml/min, temperature increase 10° C./min)

(2) Reduced pressure TG-DTA
Mass 50% reduction temperature: 138° C. (10 Torr, Ar flow rate: 50 ml/min, temperature increase 10° C./min)

(3) 1H-NMR (heavy benzene)
1.01-1.08 ppm (6H, multiplet), 1.18-1.26 ppm (18H, multiplet), 1.48-1.53 ppm (6H, multiplet), 2.86-3.10 ppm (4H, multiplet)

(4) Elemental analysis (theoretical values)
C: 49.4% (49.18%), H: 7.8% (7.80%), N: 12.7% (12.75%)

[Example 2] Synthesis of Compound No. 31

10.35 g of N'-(tert-butyl)-N-ethylpropionimidoamide and 120 mL of dehydrated THF were put into a reaction flask, and sufficiently mixed. 36.7 ml of an n-butyllithium hexane solution (1.55 M) was added dropwise to the obtained solution under ice-cooling and stirred for 1 hour. 7.0 g of ruthenium tricarbonyl dichloride and 273 mL of dehydrated THF were put into a separately prepared reaction flask, and sufficiently mixed and then the above-described reaction solution was added dropwise thereto under ice-cooling. The reaction solution was stirred at room temperature for 2 hours and then heated to reflux at 80° C. for 10 hours. After stirring, the temperature was returned to room temperature and filtering was performed. In the obtained filtrate, the solvent was removed in an oil bath at 75° C. under a reduced pressure. The obtained ruthenium complex was distilled in an oil bath at 145° C. and at 15 Pa, and thereby 0.95 g of a bright yellow viscous liquid was obtained.

(Analysis Values)
(1) Atmospheric pressure TG-DTA
Mass 50% reduction temperature: 224° C. (760 Torr, Ar flow rate: 100 ml/min, temperature increase 10° C./min)

(2) Reduced pressure TG-DTA
Mass 50% reduction temperature: 151° C. (10 Torr, Ar flow rate: 50 ml/min, temperature increase 10° C./min)

(3) 1H-NMR (heavy benzene)
0.86-0.97 ppm (6H, multiplet), 1.06-1.09 ppm (6H, multiplet), 1.21-1.30 ppm (18H, multiplet), 1.89-1.98 ppm (4H, multiplet), 2.83-3.11 ppm (4H, multiplet)

(4) Elemental analysis (theoretical values)
C: 51.3% (51.37%), H: 8.0% (8.19%), N: 12.0% (11.98%)

[Example 3] Synthesis of Compound No. 46

5.5 g of ruthenium tricarbonyl dichloride and 80 mL of dehydrated THF were put into a reaction flask, and sufficiently mixed. A N,N'-diisopropyl-propyl amidinatolithium THF solution prepared from 5.7 g of N,N'-diisopropylcarbodiimide and 1.58 g of ethyl lithium was added dropwise to the obtained suspension under ice-cooling. After stirring at room temperature for 19 hours, the solvent was removed in an oil bath at 75° C. under a reduced pressure. The produced ruthenium complex was put into a flask, which was connected to a Kugelrohr purification device, and distillation was performed at a heating temperature of 125° C. and at 27 Pa, and thereby 0.5 g of a yellow viscous solid was obtained.

(Analysis Values)
(1) Atmospheric pressure TG-DTA
Mass 50% reduction temperature: 222° C. (760 Torr, Ar flow rate: 100 ml/min, temperature increase 10° C./min)

(2) Reduced pressure TG-DTA
Mass 50% reduction temperature: 153° C. (10 Torr, Ar flow rate: 50 ml/min, temperature increase 10° C./min)

(3) 1H-NMR (heavy benzene)

0.82-0.86 ppm (3H, triplet), 1.00-1.01 (3H, doublet), 1.15-1.16 ppm (6H, doublet), 1.22-1.24 (3H, doublet), 1.75-1.90 ppm (2H, multiplet), 3.29-3.38 ppm (1H, septet), 3.59-3.69 ppm (1H, septet)

(4) Elemental analysis (theoretical values)

C: 51.5% (51.37%), H: 8.2% (8.19%), N: 11.8% (11.98%)

[Example 4] Synthesis of Compound No. 74

5.2 g of ruthenium tricarbonyl dichloride and 80 mL of dehydrated THF were put into a reaction flask and sufficiently mixed. A N,N'-diisopropyl-butylamidinatomagnesium chloride THF solution prepared from 5.4 g of N,N'-diisopropylcarbodiimide and 4.3 g of propyl magnesium chloride was added dropwise to the obtained suspension under ice-cooling. After stirring at room temperature for 19 hours, the solvent was removed in an oil bath at 75° C. under a reduced pressure. The produced ruthenium complex was put into a flask, which was connected to a Kugelrohr purification device, and distillation was performed at a heating temperature of 145° C. and at 42 Pa, and thereby 0.6 g of a brown viscous liquid (crystallized at room temperature) was obtained.

(Analysis Values)

(1) Atmospheric pressure TG-DTA

Mass 50% reduction temperature: 222° C. (760 Torr, Ar flow rate: 100 ml/min, temperature increase 10° C./min)

(2) Reduced pressure TG-DTA

Mass 50% reduction temperature: 157° C. (10 Torr, Ar flow rate: 50 ml/min, temperature increase 10° C./min)

(3) 1H-NMR (heavy benzene)

0.75-0.79 ppm (3H, triplet), 1.02-1.04 (3H, doublet), 1.17-1.19 ppm (6H, doublet-doublet), 1.24-1.26 (3H, doublet), 1.31-1.41 ppm (2H, sextet), 1.79-1.93 ppm (2H, multiplet), 3.34-3.43 ppm (1H, septet), 3.64-3.73 ppm (1H, septet)

(4) Elemental analysis (theoretical values)

C: 53.4 (53.31%), H: 8.5% (8.54%), N: 11.2 (11.30%)

[Example 5] Synthesis of Compound No. 214

4.9 g of ruthenium tricarbonyl dichloride and 80 mL of dehydrated THF were put into a reaction flask and sufficiently mixed. A N,N'-diisopropyl-pentylamidinatolithium THF solution prepared from 5.1 g of N,N'-diisopropylcarbodiimide and 2.5 g of n-butyllithium was added dropwise to the obtained suspension under ice-cooling. After stirring at room temperature for 19 hours, the solvent was removed in an oil bath at 75° C. under a reduced pressure. The produced ruthenium complex was put into a flask, which was connected to a Kugelrohr purification device, and distillation was performed at a heating temperature of 150° C. and 55 Pa, and thereby 0.5 g of a brown viscous liquid was obtained.

(Analysis Values)

(1) Atmospheric pressure TG-DTA

Mass 50% reduction temperature: 230° C. (760 Torr, Ar flow rate: 100 ml/min, temperature increase 10° C./min)

(2) Reduced pressure TG-DTA

Mass 50% reduction temperature: 162° C. (10 Torr, Ar flow rate: 50 ml/min, temperature increase 10° C./min)

(3) 1H-NMR (heavy benzene)

0.79-0.83 ppm (3H, triplet), 1.04-1.06 (3H, doublet), 1.19-1.22 ppm (8H, multiplet), 1.26-1.28 (3H, doublet), 1.32-1.41 ppm (2H, sextet), 1.86-2.00 ppm (2H, multiplet), 3.39-3.48 ppm (1H, septet), 3.69-3.78 ppm (1H, septet)

(4) Elemental analysis (theoretical values)

C: 54.9 (55.04%), H: 8.8% (8.85%), N: 10.8 (10.70%)

[Evaluation Example 1] Evaluation of Physical Properties of Ruthenium Compounds

Regarding Compounds Nos. 10, 31, 46, 74 and 214 of the present invention obtained in Examples 1 to 5 and the following Comparative Compounds 1 and 2, using a TG-DTA measuring device, the temperature (L) when the mass of sample was reduced by 50 mass % due to heating under an ordinary pressure atmosphere (760 torr) was checked. It was possible to determine that a compound having a low L was preferable because the vapor pressure was then high. In addition, the state at 25° C. was visually observed. For those in a solid state at 25° C., the melting point was measured. The results are shown in Table 1. Here, in the chemical formulae of the following Comparative Compound 1 and Comparative Compound 2, "Me" represents a methyl group, "Et" represents an ethyl group, and "tBu" represents a tert-butyl group.

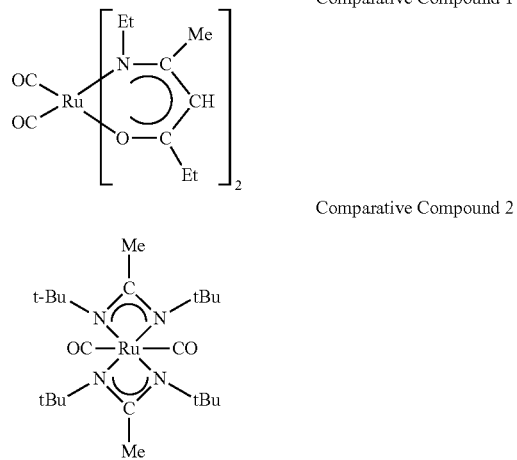

| | Compound | L/° C. | State at 25° C. | Melting point/° C. |
|---|---|---|---|---|
| Evaluation Example 1-1 | Compound No. 10 | 215 | Liquid | — |
| Evaluation Example 1-2 | Compound No. 31 | 225 | Liquid | — |
| Evaluation Example 1-3 | Compound No. 46 | 220 | Solid | 80 |
| Evaluation Example 1-4 | Compound No. 74 | 220 | Solid | 75 |
| Evaluation Example 1-5 | Compound No. 214 | 230 | Liquid | — |
| Comparative Example 1 | Comparative Compound 1 | 240 | Solid | 120 |
| Comparative Example 2 | Comparative Compound 2 | 250 | Solid | 210 |

Based on the results in Table 1, it was found that all of Compounds Nos. 10, 31, 46, 74 and 214 had a higher vapor pressure and a lower melting point than Comparative Compound 1 and Comparative Compound 2. It was found, among these, Compounds Nos. 10, 31 and 214 had a significantly lower melting point than a comparative compound having a similar structure. In addition, it was found that Compounds Nos. 10 and 31 had a particularly high vapor pressure.

[Example 6] Production of Metal Ruthenium Thin Film

Compound No. 10 was used as a raw material for an atomic layer deposition method, and a metal ruthenium thin film was produced on a silicon wafer according to the ALD method under the following conditions using the device shown in FIG. 1.

When the thin film composition of the obtained thin film was checked through X-ray photoelectron spectroscopy, the obtained thin film had a composition of metal ruthenium, and the residual carbon content was smaller than 1.0 atom %. In addition, when the film thickness was measured according to an X-ray reflectance method and its average value was calculated, the film thickness on average was 26.4 nm, and the film thickness obtained for one cycle on average was 0.05 nm.

(Conditions)
Substrate: silicon wafer
Reaction temperature (silicon wafer temperature): 350° C.
Reactive gas: oxygen
A series of processes including the following (1) to (4) was set as one cycle, and repeated 500 cycles.
(1) A raw material for an atomic layer deposition method vaporized under conditions of a raw material container temperature of 140° C. and a pressure in the raw material container of 100 Pa was introduced into a film-forming chamber, and deposition was performed at a system pressure of 100 Pa for 30 seconds;
(2) Purging with argon gas was performed for 15 seconds and thereby non-deposited raw material was removed;
(3) A reactive gas was introduced into the film-forming chamber and reacted at a system pressure of 100 Pa for 5 seconds;
(4) Purging with argon gas was performed for 15 seconds and thereby unreacted reactive gases and by-product gases were removed.

[Example 7] Production of Metal Ruthenium Thin Film

A metal ruthenium thin film was produced under the same conditions as in Example 6 except that Compound No. 31 was used as a raw material for an atomic layer deposition method. When the thin film composition of the obtained thin film was checked through X-ray photoelectron spectroscopy, the obtained thin film had a composition of metal ruthenium, and the residual carbon content was smaller than 1.0 atom %. In addition, when the film thickness was measured according to an X-ray reflectance method and its average value was calculated, the film thickness on average was 25.7 nm, and the film thickness obtained for one cycle on average was 0.05 nm.

[Example 8] Production of Metal Ruthenium Thin Film

A metal ruthenium thin film was produced under the same conditions as in Example 6 except that Compound No. 46 was used as a raw material for an atomic layer deposition method. When the thin film composition of the obtained thin film was checked through X-ray photoelectron spectroscopy, the obtained thin film had a composition of metal ruthenium, and the residual carbon content was smaller than 1.0 atom %. In addition, when the film thickness was measured according to an X-ray reflectance method and its average value was calculated, the film thickness on average was 26.3 nm and the film thickness obtained for one cycle on average was 0.05 nm.

[Example 9] Production of Metal Ruthenium Thin Film

Compound No. 10 was used as a raw material for an atomic layer deposition method, and a metal ruthenium thin film was produced on a silicon wafer according to the ALD method under the following conditions using the device shown in FIG. 1.

When the thin film composition of the obtained thin film was checked through X-ray photoelectron spectroscopy, the obtained thin film had a composition of metal ruthenium, and the residual carbon content was smaller than 1.0 atom %. In addition, when the film thickness was measured according to an X-ray reflectance method and its average value was calculated, the film thickness on average was 15 nm, and the film thickness obtained for one cycle on average was 0.03 nm.

(Conditions)
Substrate: silicon wafer
Reaction temperature (silicon wafer temperature): 350° C.
Reactive gas: hydrogen
A series of processes including the following (1) to (4) was set as one cycle, and repeated over 500 cycles.
(1) A raw material for an atomic layer deposition method vaporized under conditions of a raw material container temperature of 140° C. and a pressure in the raw material container of 100 Pa was introduced into a film-forming chamber, and deposition was performed at a system pressure of 100 Pa for 30 seconds.
(2) Purging with argon gas was performed for 15 seconds and thereby non-deposited raw material was removed.
(3) A reactive gas was introduced into the film-forming chamber and reacted at a system pressure of 100 Pa for 60 seconds.
(4) Purging with argon gas was performed for 15 seconds and thereby unreacted reactive gases and by-product gases were removed.

[Comparative Example 3] Production of Metal Ruthenium Thin Film

A metal ruthenium thin film was produced under the same conditions as in Example 6 except that Comparative Compound 2 was used as a raw material for an atomic layer deposition method. When the thin film composition of the obtained thin film was checked through X-ray photoelectron spectroscopy, the obtained thin film had a composition of metal ruthenium, and the residual carbon content was 6.0 atom %. In addition, when the film thickness was measured according to an X-ray reflectance method and its average value was calculated, the film thickness on average was 10 nm, and the film thickness obtained for one cycle on average was 0.02 nm.

Based on the results of Examples 6 to 9, it was found that it was possible to produce a metal ruthenium thin film having a small residual carbon content and high quality in all of the examples. In contrast, it was found that the thin film obtained in Comparative Example 3 was a metal ruthenium thin film having a very large residual carbon content and poor quality. In addition, comparing the film thicknesses obtained for one cycle in Examples 6 to 8 and Comparative Example 3, it was found that, in Examples 6 to 8, it was possible to produce a metal ruthenium thin film with a productivity at least twice that of Comparative Example 3.

Based on the above results, it was found that, according to the present invention, it was possible to produce a metal ruthenium thin film having high quality with high productivity according to the ALD method.

The invention claimed is:

1. A ruthenium compound represented by the following general formula (1):

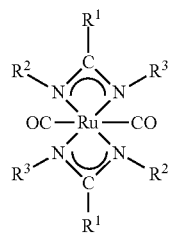

(1)

wherein, $R^1$ to $R^3$ each independently represent a $C_{1-5}$ alkyl group, provided that when $R^1$ is a methyl group, $R^2$ and $R^3$ are groups different from each other.

2. A raw material for forming a thin film, the raw material comprising the ruthenium compound according to claim 1.

3. A method of producing a thin film containing ruthenium atoms on a surface of a substrate, comprising the steps of:

vaporizing the raw material for forming a thin film according to claim 2 to produce vapor containing the ruthenium compound;

introducing the vapor into a processing atmosphere; and depositing the compound on a substrate through decomposition of the compound or chemical reaction of the compound, or through both deposition and chemical reaction of the compound.

* * * * *